US 006645861B2

(12) United States Patent
Cabral, Jr. et al.

(10) Patent No.: US 6,645,861 B2
(45) Date of Patent: Nov. 11, 2003

(54) SELF-ALIGNED SILICIDE PROCESS FOR SILICON SIDEWALL SOURCE AND DRAIN CONTACTS

(75) Inventors: Cyril Cabral, Jr., Ossining, NY (US); Kevin K. Chan, Staten Island, NY (US); Guy Moshe Cohen, Mohegan Lake, NY (US); Kathryn Wilder Guarini, Yorktown Heights, NY (US); Christian Lavoie, Ossining, NY (US); Paul Michael Solomon, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 09/836,197

(22) Filed: Apr. 18, 2001

(65) Prior Publication Data

US 2002/0155690 A1 Oct. 24, 2002

(51) Int. Cl.$^7$ .............................................. H01L 21/44
(52) U.S. Cl. ................... 438/682; 438/595; 438/596; 438/655; 438/656; 438/664; 438/683
(58) Field of Search .................. 438/596, 682, 438/630, 649, 655, 595, 656, 664, 683

(56) References Cited

U.S. PATENT DOCUMENTS

| | | |
|---|---|---|
| 5,510,295 A | 4/1996 | Cabral, Jr. et al. |
| 5,608,266 A | 3/1997 | Agnello et al. |
| 5,624,869 A | 4/1997 | Agnello et al. |
| 5,773,331 A | 6/1998 | Solomon et al. |
| 5,830,775 A | 11/1998 | Maa et al. |
| 5,994,191 A | 11/1999 | Xiang et al. |
| 6,054,386 A | 4/2000 | Prabhakar |
| 6,087,208 A | 7/2000 | Krivokapic et al. |
| 6,169,005 B1 | 1/2001 | Kepler et al. |
| 6,323,130 B1 * | 11/2001 | Brodsky et al. ............ 438/682 |
| 6,444,578 B1 | 9/2002 | Cabral, Jr. et al. |
| 6,503,833 B1 | 1/2003 | Ajmera et al. |

OTHER PUBLICATIONS

Kern (Ken) Rim, Judy L. Hoyt, and James F. Gibbons, "Transconductance Enhancement in Deep Submicron Strained–Si n–MOSFETs", IEEE, Sep. 1998, pp. 1–4.

T. Yoshitomi, M. Saito, T. Ohguro, M. Ono, H.S. Momose, and H. Iwai, "Silicided Silicon–Sidewall Source and Drain ($S^4$ D) Structure for High–Performance 75–nm Gate Length pMOSFETs", Symposium on VLSI Technology Digest of Technical Papers, Apr. 1995, pp. 11 and 12.

K. Rim, J. Welser, J.L. Hoyt, and J.F. Gibbons, "Enhanced Hole Mobilities in Surface–Channel Strained–Si p–MOS-FETs", IEEE, 1995, pp. 1–4.

* cited by examiner

Primary Examiner—Amir Zarabian
Assistant Examiner—Khanh Duong
(74) Attorney, Agent, or Firm—Robert M. Trapp, Esq.; McGinn & Gibb, PLLC (57) ABSTRACT

A method (and structure formed thereby) of forming a metal silicide contact on a non-planar silicon containing region having controlled consumption of the silicon containing region, includes forming a blanket metal layer over the silicon containing region, forming a silicon layer over the metal layer, etching anisotropically and selectively with respect to the metal the silicon layer, reacting the metal with silicon at a first temperature to form a metal silicon alloy, etching unreacted portions of the metal layer, annealing at a second temperature to form an alloy of metal-$Si_2$, and selectively etching the unreacted silicon layer.

35 Claims, 9 Drawing Sheets

PURE Si SIDEWALLS

FIG.11(b)

Ge INTRODUCED INTO THE Si SIDEWALLS

SELF-ALIGNED SILICIDE PROCESS FOR SILICON SIDEWALL SOURCE AND DRAIN CONTACTS

CROSS-REFERENCE TO RELATED APPLICATIONS

The present application is related to U.S. patent application Ser. No. 09/569,306, filed on May 11, 2000, to Chan et al., entitled "SELF-ALIGNED SILICIDE PROCESS FOR LOW RESISTIVITY CONTACTS TO THIN FILM SILICON-ON-INSULATOR MOSFETS", having IBM Docket No. YO999-408, assigned to the present assignee, and incorporated herein by reference, to U.S. patent application Ser. No. 09/515,033, filed on Mar. 6, 2000, to Cabral et al., entitled "METHOD FOR SELF-ALIGNED FORMATION OF SILICIDE CONTACTS USING METAL SILICON ALLOYS FOR LIMITED SILICON CONSUMPTION AND FOR REDUCTION OF BRIDGING", having IBM docket No. YOR9-2000-0018, assigned to the present assignee, and incorporated herein by reference, and to U.S. patent application Ser. No. 09/712,264, filed on Nov. 15, 2000, by Cohen et. al, entitled "SELF-ALIGNED SILICIDE (SALICIDE) PROCESS FOR STRAINED SILICON MOSFET ON SIGE AND STRUCTURE FORMED THEREBY", having IBM docket No. YOR9-2000-00373, and incorporated herein by reference.

U.S. GOVERNMENT RIGHTS IN THE PATENT

The present invention was at least partially funded under Defense Advanced Research Projects Agency (DARPA) Contract No. N66001-97-1-8908, and the U.S. Government has at least some rights under any subsequently-issued patent.

BACKGROUND OF THE INVENTION

1. Field of the Invention

The present invention relates to silicon metal oxide semiconductor field effect transistor (MOSFET), and to a method of forming a metal silicide contacts to the Si MOSFET.

2. Description of the Related Art

Metal oxide silicon semiconductor field effect transistor (MOSFET) scaling requires the continuous reduction of the gate length. When the MOSFET channel is made short, the device threshold voltage, Vt, becomes dependent on the gate length. The effect, known as the "short channel effect (SCE)", must be circumvented or otherwise devices with different gate lengths would have a different turn-on voltage. Since a variance in the gate length is always expected due to production tools tolerance, the dependency of Vt on the gate size may cause the circuits to fail.

To suppress SCE, a scaling of the silicon-on-insulator (SOI) film thickness is needed. As shown below, the design of a device with a shorter gate length would require the use of a thinner SOI channel. Moreover, this design rule holds for both a single gate MOSFET and a double gate MOSFET.

Figure 1:
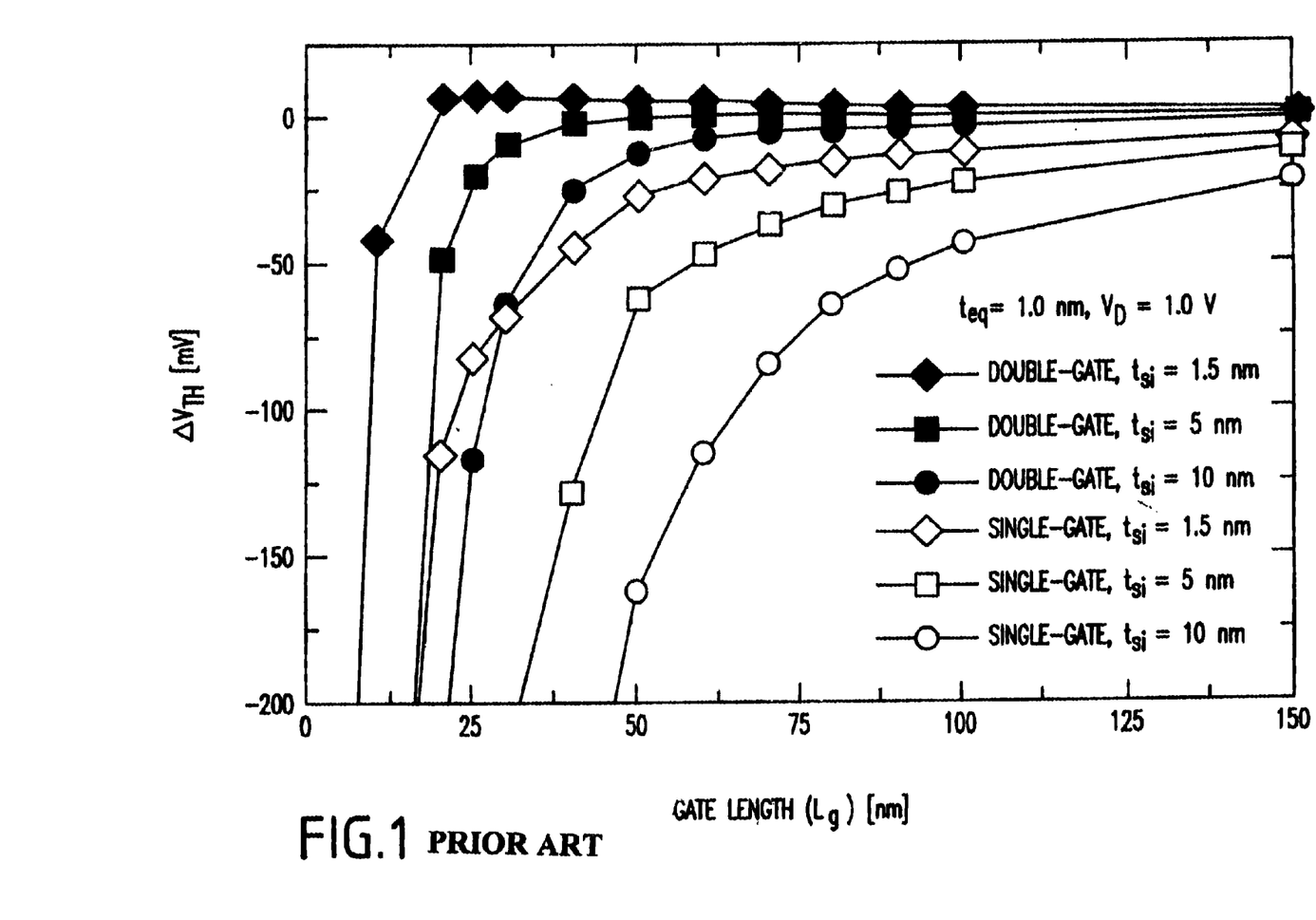
FIG. 1 illustrates a change in threshold voltage (Vt) of a MOSFET as a function of a gate length for different Si channel thicknesses.

That is, FIG. 1 shows the change in Vt as a function of the gate length for different SOI channel thicknesses ($t_{si}$). Specifically, FIG. 1 shows that when a very short gate length is produced, instead of obtaining a very flat Vt, a sharp roll-off of Vt is shown. It is noted that, in any given manufacturing, there is always some tolerance since it is not possible to print exactly the same from wafer-to-wafer and even from device-to-device on the same wafer. Hence, in fact there will be some tolerance (e.g., 10% variation in gate length across the wafer). If such a tolerance/variance is made on the flat region of the plot of the gate length of FIG. 1, no problem should arise.

However, if such a 10% gate length variation occurs on the sloping portion of FIG. 1, then a problem may occur in that there will be a great difference in the threshold voltage (Vt) of devices across the wafer. That is, some devices on the wafer may begin conducting at lower voltages, whereas other devices would begin conducting at higher voltages. Thus, the circuit may not work and FIG. 1 shows the importance of controlling the gate length. Hence, some problems may arise as technology progressing to very short gate lengths.

Further, it is noted that in FIG. 1, both single and double gate MOSFETs show an improved SCE behavior when a thinner channel is used. However, making the SOI channel thinner imposes a new challenge. That is, as the channel is made thinner, the series resistance to the source and drain increases. The parasitic series resistance can affect the speed of the device, and therefore must be minimized. To reduce the resistance, the source and drain regions are thickened. An optimized device would have a thin channel region for suppression of SCE, and thick source and drain regions for low series resistance. Making the source and drain thicker may be achieved by selective epitaxy, but that would add silicon only to the source, drain and gate regions.

Figure 2A:
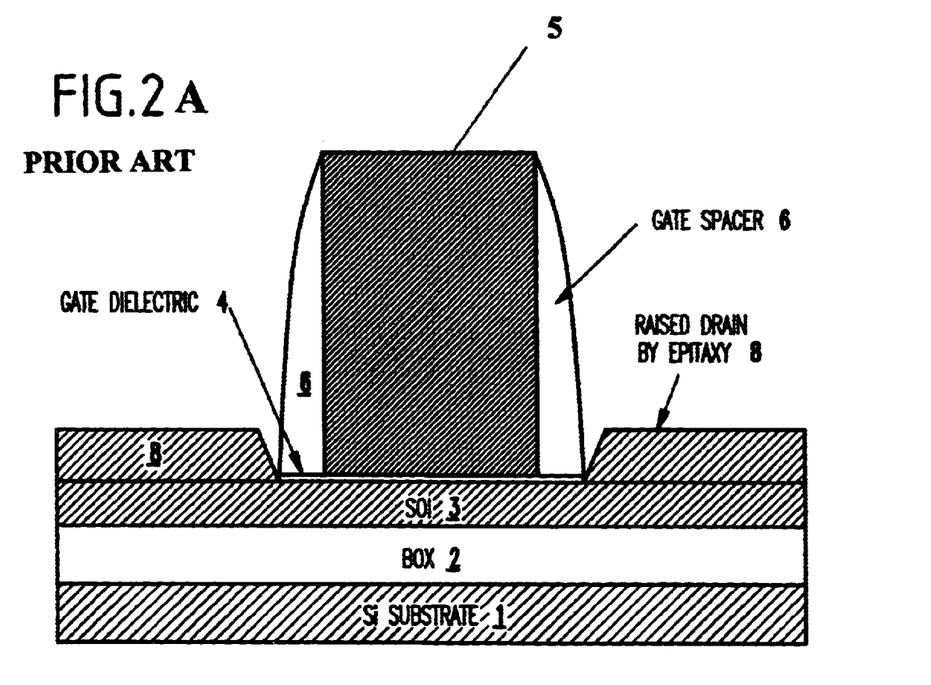
FIG. 2A illustrates a MOSFET structure with "thickened" silicon source and drain by epitaxy.

FIG. 2A illustrates a MOSFET structure with a "thickened" silicon source and drain 8 by epitaxy. Specifically, FIG. 2A shows a silicon substrate 1, having a buried oxide layer 2 formed thereon. A silicon-on-insulator (SOI) layer 3 is formed on the BOX layer 2. A gate dielectric 4 is formed on the SOI 3, with a gate 5 being formed on the gate dielectric 4. Gate spacers 6 are also provided on sidewalls of the structure. The Si epitaxy must be selective or otherwise silicon will be deposited on the device gate spaces 6 which would short the source and drain to the gate.

However, selective silicon epitaxy usually requires high growth temperatures (e.g., about 850–1200° C.), and is very sensitive to surface preparation (especially cleaning), which makes it a volatile technique for production. Indeed, the process is highly selective such that the surface chemistry becomes extremely important. For example, if there is a small amount of oxide such as a native oxide or the like which remains on the surface, there will be no growth at those areas, thereby making the yield very poor.

A simpler and more robust technique to contact the thin SOI channel is by forming silicon sidewall contacts to the source and drain, as described in T. Yoshitomi, M. Saito, T. Ohguro, M. Ono, H. S. Momose, and H. Iwai, "Silicided Silicon-sidewall Source and Drain Structure for High Performance 75-nm Gate Length pMOSFETs," 1995 Symposium on VLSI Technology Digest, page 11 (e.g., Ref. 1). This method was also shown to be very useful also in the case of double gate MOSFET structures, as described in U.S. Pat. No. 5,773,331, to P. M. Solomon et al. entitled "Method for Making Single and Double Gate Field Effect Transistors with Sidewall Source Drain Contacts", and incorporated herein by reference (e.g., Ref. 2).

This method includes depositing a silicon film (e.g., poly-Si) and etching it with a directional etcher (e.g., such as reactive ion etching (RIE)) to form Si sidewalls on either side of the gate. The sidewall forms an extension of the source and the drain on which metal contacts can be later formed.

Figure 2B:
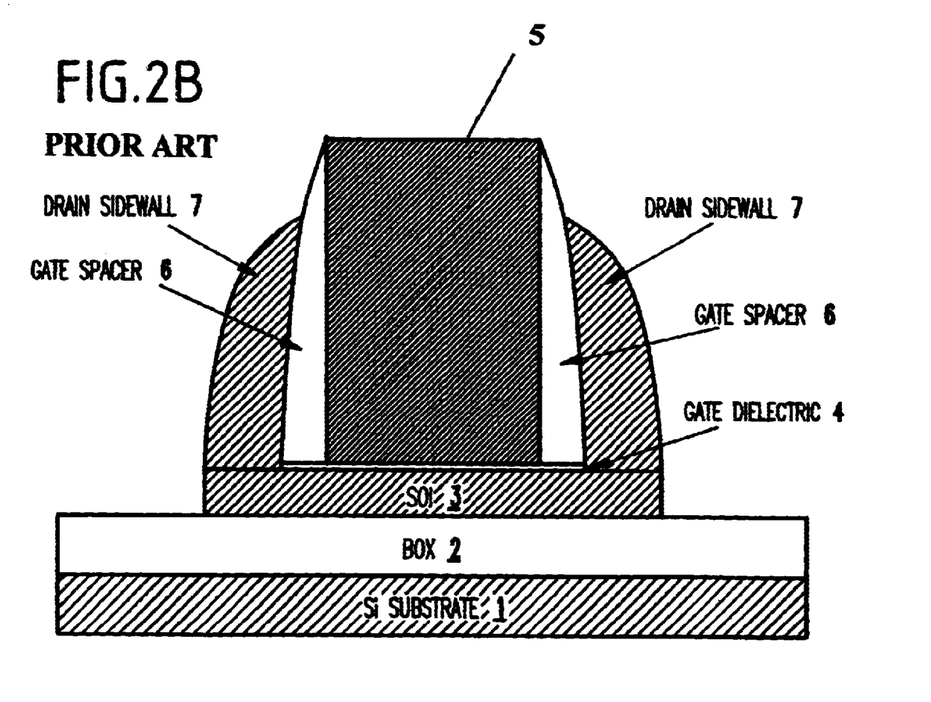
FIG. 2B illustrates a typical MOSFET structure with silicon source and drain sidewalls.

FIG. 2B illustrates a typical MOSFET structure with silicon source and drain sidewalls 7. The sidewall technique does not require a selective deposition and the deposition temperature can be relatively low (e.g., such as lower than approximately 700° C. depending upon the gas precursor used; for example, silane ($SiH_4$) can be used at approximately 460° C. but has poor selectivity). Moreover, the deposited silicon can be re-crystallized (i.e., by using the thin SOI as a seed) using a rapid thermal anneal (RTA).

To make low resistance contacts, the use of a silicide is required, regardless of the source and drain structure (e.g., sidewall or epitaxially grown). The conventional self-aligned silicide process (salicide) used for planar source and drain must be modified in the case of a silicon sidewall source and drain. However, a direct application of the standard salicide process to the sidewall source and drain shows the following problems.

Figure 3:
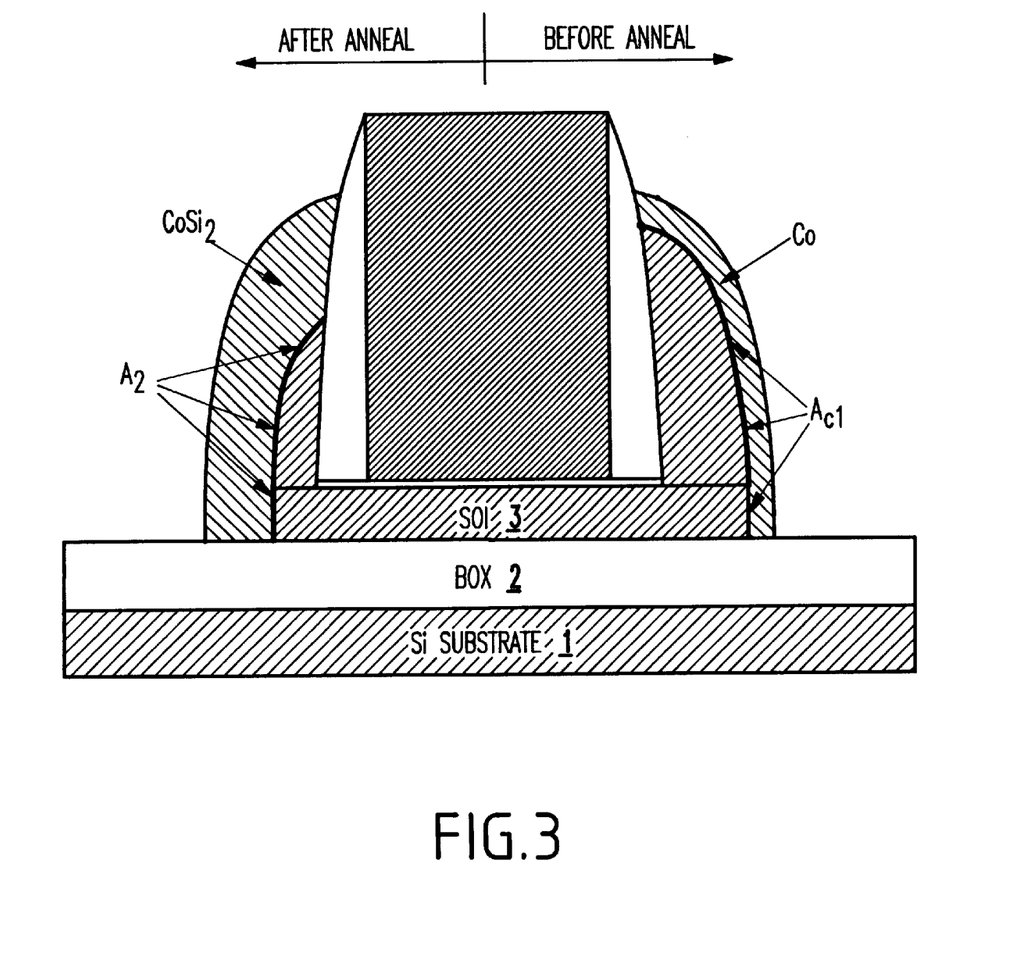
FIG. 3 illustrates a reduction of the contact area due to the Si consumption by the silicide reaction.

First, as illustrated in FIG. 3, reduction of the contact area occurs due to the Si consumption by the silicide reaction, which increases the series resistance. That is, the left-hand Si sidewall in FIG. 3 has been mostly converted into $CoSi_2$. The resulting contact are, $A_{c2}$ is therefore reduced compared to the contact areas $A_{c1}$, before anneal.

Figure 4:
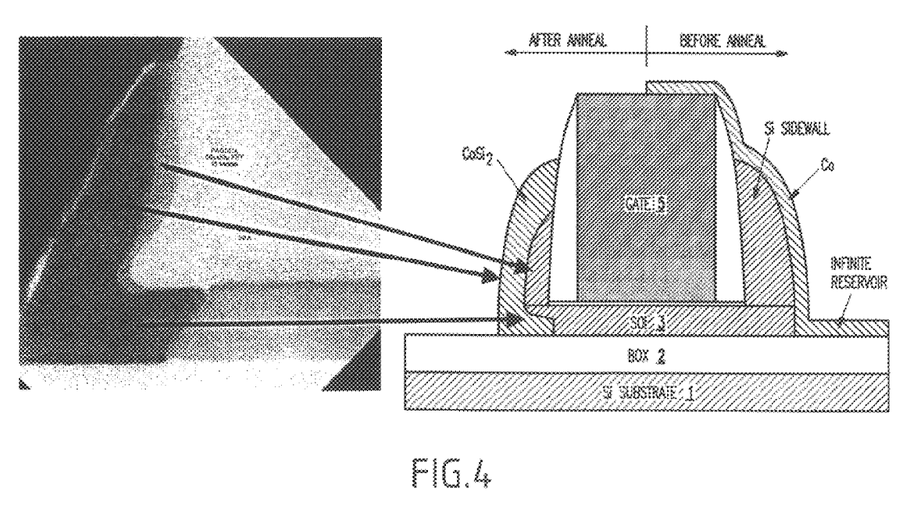
FIG. 4 illustrates a transmission electron micrograph (TEM) and a schematic of a portion of the MOSFET of FIG. 2B showing the encroachment of the silicide onto the Si channel.

Secondly, as shown in the schematic of FIG. 4 and the associated transmission electron micrograph (TEM), encroachment of the silicide into the Si channel occurs. The problem arises due to an infinite reservoir of metal at the base of the sidewall. While the metal reaction with the silicon sidewall is self-limited due to the finite thickness of the metal covering the sidewall, the supply of metal at the base of the sidewall is not limited. Thus, encroachment of the channel occurs. The TEM shows a dark region and a lighter region (and a clear boundary therebetween) of the channel region. The dark region represents the silicide encroaching into the channel under the gate. This encroachment is highly undesirable and leads to faulty device operation/failure.

Another problem shown in FIG. 4 is that the sidewalls are of unequal size and shape. That is, the left sidewall has been diminished as compared to the right sidewall. Generally, it is desirable to have as large a surface area for the sidewall as possible, since this is the contact area. The larger the contact area, the lower the resistivity the device will have. Hence, a method is desirable which consumes as little of the sidewall as possible. Thus, ideally, the sidewalls before annealing would have substantially the same size/shape as after the annealing. However, prior to the present invention, such a technique has not been developed.

SUMMARY OF THE INVENTION

In view of the foregoing and other problems, disadvantages, and drawbacks of the conventional methods, an object of the present invention is to provide a new self-aligned (salicide) method which is applicable to silicon sidewall source and drain contacts.

In a first aspect of the present invention, a method for forming a metal silicide contact on a non-planar silicon containing region having controlled consumption of the silicon containing region, includes forming a blanket metal layer over the silicon containing region, forming a silicon layer over the metal layer, etching anisotropically and selectively with respect to the metal said silicon layer, reacting the metal with silicon at a first temperature to form a metal silicon alloy, etching unreacted portions of the metal layer, annealing at a second temperature to form an alloy of metal-$Si_2$, and selectively etching the unreacted silicon layer.

In a second aspect, a method of forming a semiconductor structure, includes providing a semiconductor substrate to be silicided including a sidewall source region and a sidewall drain region formed on respective sides of a gate, forming a metal film over the gate and the source and drain regions, forming a silicon film over the metal, etching anisotropically and selectively the silicon film, reacting the metal film with Si at a first temperature to form a metal-silicon alloy, etching unreacted portions of the metal, annealing the structure at a second temperature to form a metal-$Si_2$ alloy; and selectively etching the unreacted Si.

In a third aspect of the present invention, a method of forming a silicide, includes providing a substrate to be silicided including forming a metal-silicon mixture over predetermined regions of the substrate, forming a silicon film over the metal-silicon mixture, etching anisotropically and selectively the silicon film, reacting the metal-silicon mixture with Si at a first temperature to form a metal-rich phase, etching any unreacted portion of the metal-silicon mixture, annealing the substrate at a second temperature, to form a metal-$Si_2$ alloy, and selectively etching the unreacted Si.

In yet another aspect, a semiconductor structure according to the present invention, includes a non-planar silicon containing region, and a metal disilicide contact formed on the non-planar silicon containing region, wherein the non-planar silicon containing region includes Ge.

With the unique and unobvious features of the present invention, reduction of the contact area occurring due to the Si consumption by the silicide reaction is prevented. Hence, there is no increase of the parasitic series resistance, as in the conventional methods and structures.

Further, encroachment of the silicide into the Si channel does not occur. That is, unlike the conventional structures and methods, there is not an infinite reservoir of metal available at the base of the sidewall.

Further, the sidewalls appear substantially the same size and shape before and after the annealing, thereby maintaining as much of the contact area as possible for the device.

BRIEF DESCRIPTION OF THE DRAWINGS

The foregoing and other purposes, aspects and advantages will be better understood from the following detailed description of a preferred embodiment of the invention with reference to the drawings, in which:

FIGS. 5–9 illustrate processing steps of a method according to a preferred embodiment of the present invention in which:

DETAILED DESCRIPTION OF THE PREFERRED EMBODIMENTS OF THE PRESENT INVENTION

Turning now to FIGS. 2B and 5–11B, preferred embodiment of the present invention will be described hereinafter.

However, prior to discussing the present invention in detail, it is noted that, for the sake of simplicity only and not for limiting the scope of the invention in any way, the method discussed below is for the specific case of Cobalt (Co) silicide. Cobalt has been used because it provides a lowest resistivity silicide. Thus, although Co silicide is of a special interest due to its superior properties, the method is general and applicable to silicides formed with other metals such as Ti, Pt, Ni, Pd, W etc.

Turning now to the drawings, FIG. 2B shows an initial device to be silicided. The structure includes a Si substrate 1, a buried oxide (BOX) layer 2, a silicon-on-insulator (SOI) film 3, a gate dielectric 4, a patterned gate 5, two sidewall spacers 6, and the silicon sidewall source and drain 7. The silicon sidewalls are heavily doped and may be considered as source and drain extensions.

Figure 5:
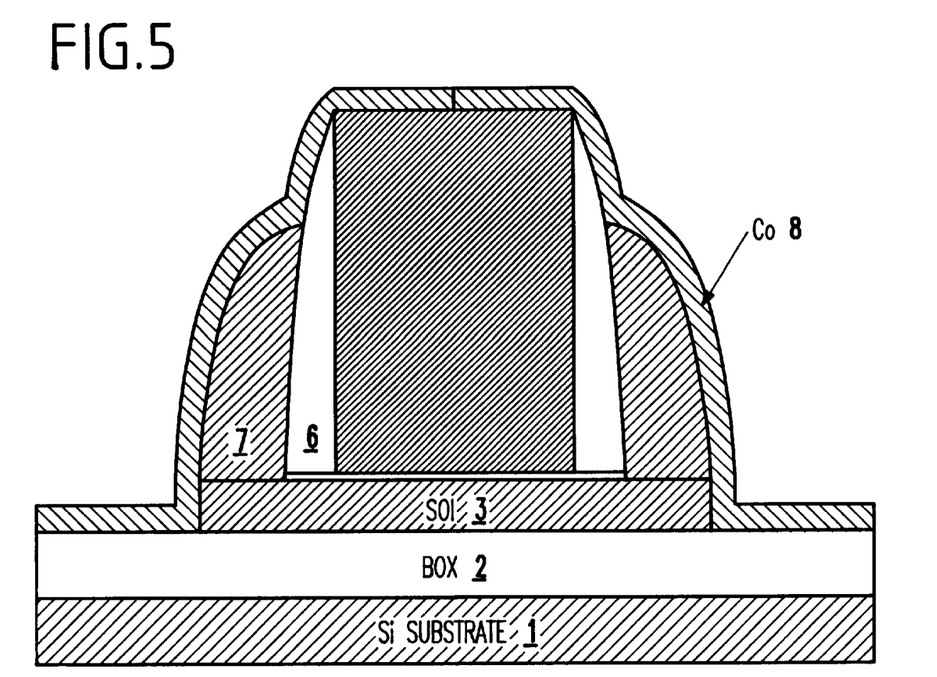
FIG. 5 illustrates a metal film 8 is deposited over the structure.

As shown in FIG. 5, a thin film 8 of metal (e.g., Co is used in the preferred embodiment due to a cobalt disilicide having a low contact resistance, but, as mentioned above, other metals can be used; in the example described below, Co will be assumed for sake of discussion and ease of the reader's understanding) is deposited over the gate, source and drain regions (unreferenced). For example, in the case of cobalt, for every 1 nm of cobalt, 3.6 nm of silicon is consumed. Thus, if the cobalt is made extremely thick, then a large amount of silicon must be consumed. By the same token, it cannot be made too thin, otherwise a non-continuous film will result. Further, even if it could be made continuous with an overly thin metal layer, then resistivity may be a problem. In view of the above and for the sake of completeness, preferably, the thin metal film 8 has a typical thickness of 8 nm, yet other thicknesses between a range of about 4 to about 10 nm can be used.

Figure 6:
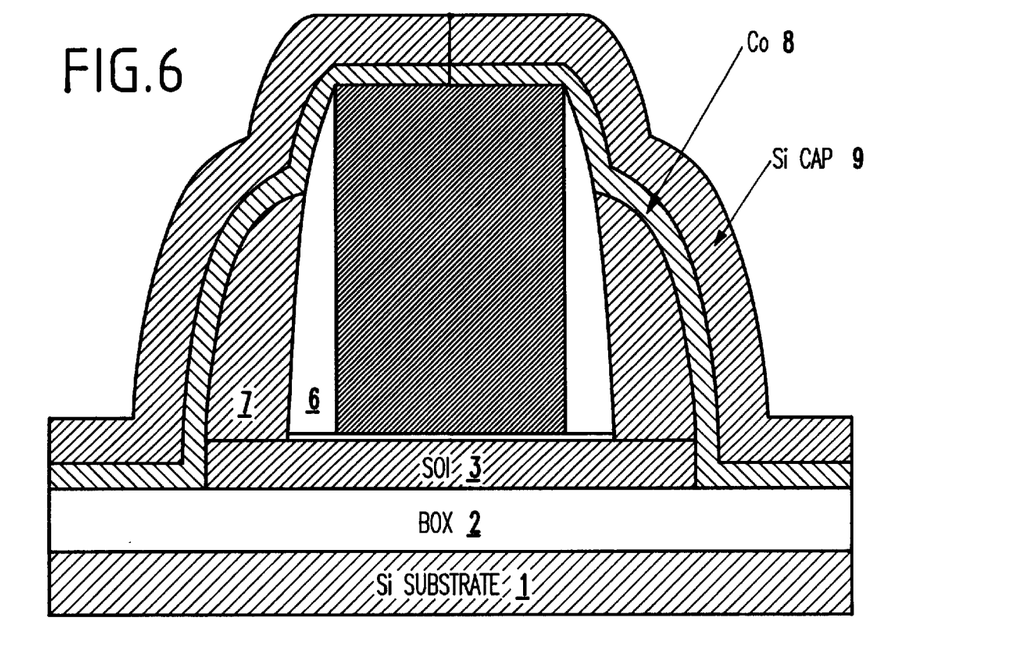
FIG. 6 illustrates a silicon cap 9 is deposited over the structure.

Following the Co deposition 8, as shown in FIG. 6, a silicon film (such as amorphous or poly-Si) is deposited over the Co film 8, as a silicon cap 9. The silicon cap 9 provides the silicon which will be consumed in the reaction with the metal to form the monosilicide. If the cap was not present, then the problems of the conventional methods would occur (e.g., encroachment, consumption of silicon sidewall, etc.) since the only source for the silicide would be from the sidewall. In the invention, with the cap 9 present, in the worst case at least half of the consumption of silicon from the sidewall can be prevented. Moreover, with some processing techniques, the silicon consumption occurring only from the cap 9 could be forced to occur.

First, it is noted that theoretically substantially all of the silicon for the reaction with the metal could be obtained from the silicon cap, and thus the sidewall silicon could be preserved. That is, amorphous silicon could be used to form the silicon cap, and the temperature of the amorphous silicon with the cobalt would be slightly lower. Hence, by carefully monitoring and controlling the temperature, such an operation of taking a substantially majority of the silicon for the reaction from the silicon cap. However, such a monitoring and controlling process is somewhat difficult to perform, as the temperature window is extremely small and such a small tolerance may not be suitable for realistic, robust manufacturing processes.

Secondly, the silicide could be formed by consuming some of the sidewall and the cap, and then going to a high enough temperature (e.g., approximately 800° C.) that the remaining silicon in the cap would diffuse through the cobalt disilicide and recrystallize on the sidewall. In this way, the sidewall spacers could be made thicker and quite possibly even thicker than with what they started out. Of course, depending upon the thermal budget, this second technique may not be as advantageous as the first technique. In addition, since the disilicide/silicon junction must be formed in doped silicon to obtain ohmic contacts, the Si cap in the later case must be doped.

An important feature of the invention is that the silicon deposition can be carried out in the same deposition chamber used for the Co deposition. This keeps the Co surface clean without exposing it to an air ambient prior to the Si deposition. Therefore, executing the Co and Si deposition sequentially (e.g., in the same chamber) without breaking the vacuum of the chamber, eliminates the chance of obtaining an undesirable interface at the Co/Si boundary. Hence, a "pure" interface is obtained at the Co/Si boundary.

Further, it is noted that the silicon cap is deposited directly on the metal before any anneal has occurred. Therefore, the consumption of the silicon can begin substantially from the beginning (e.g., at the first anneal described below) of the inventive method.

Figure 7:
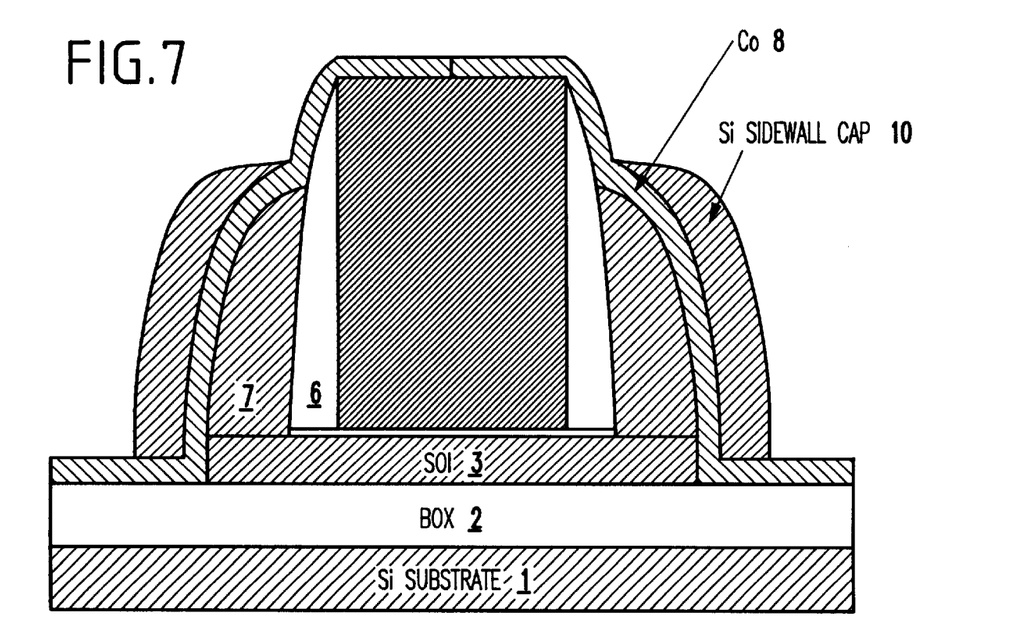
FIG. 7 illustrates the structure following the anisotropic and selective etching of the silicon cap 9.

Next, the Si cap 9 is etched using an anisotropic etch such as a reactive ion etching (RIE) to form a Si sidewall cap 10. The structure following the RIE is shown in FIG. 7. At this point, two cases are distinguished. That is, the cases are when: (1) the etch is selective to Co and will not etch the Co film 8; and (2) the etch chemistry will attack the Co film 8.

In the second case, the process should be selective to the dielectrics from which the gate spacer is formed. This etch selectivity requirement is fulfilled by RIE which is based on HBr chemistry. The HBr chemistry which is conventionally used for Si etching would not etch the Co film 8, and therefore falls under the first case. The following discussion would therefore assume that the etch is selective to Co.

Figure 8:
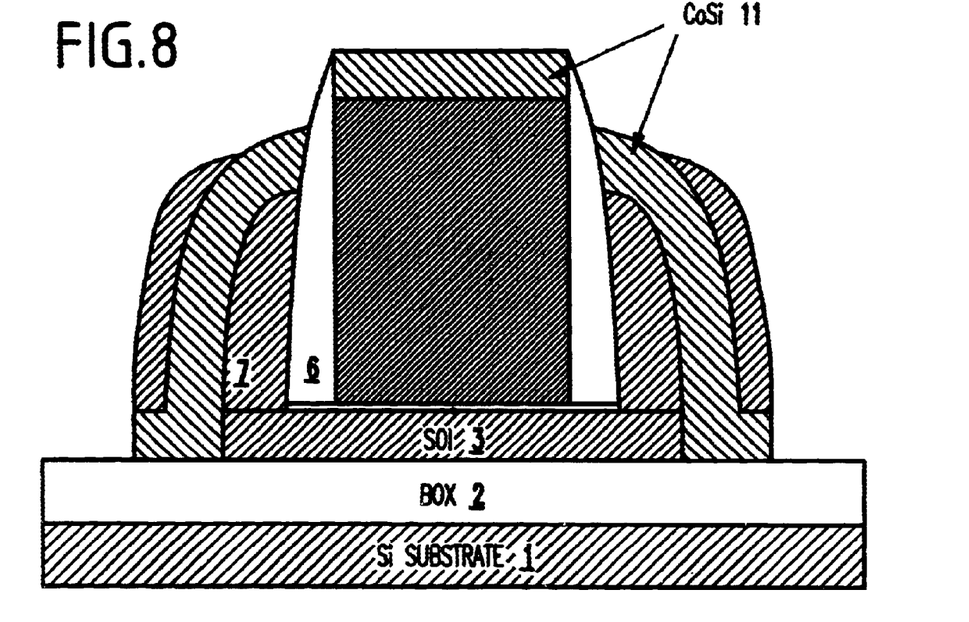
FIG. 8 illustrates the structure following a first RTA and an etching of the unreacted metal (e.g., Co) 9.

Following the RIE step, the Co film 8 would be exposed on planar surfaces, and covered by a Si sidewall on sloped surfaces. Next, the wafer is annealed by RTA to form the mono-silicide phase, CoSi 11. For the case of CoSi, the anneal temperature is about 470° C. to about 520° C. Following the anneal, the unreacted Co in the field regions and over the dielectric sidewalls is etched selectively, by for example, a wet etch or the like. The selective wet etch may use, for example, a sulfuric acid with $H_2O_2$ or the like. Thus, the unreacted metal (Co) is removed. The structure following the RTA and the etching of the unreacted Co is illustrated in FIG. 8.

During the RTA, the Co film 8 which is sandwiched between the Si sidewall 7 and the Si sidewall cap 10 reacts at both interfaces to form the CoSi phase as shown by reference numeral 11. Therefore, the consumption of the Si sidewall 7 is reduced by approximately one-half due to the Si supply on both sides of the Co film 8. Thus, the contact area is increased compared to the case where the mono-silicide film 11 is formed without the Si cap 10.

Next, the wafer is annealed by RTA (e.g., a second anneal) to form the disilicide phase, $CoSi_2$, 12. For the case of $CoSi_2$, the anneal temperature is about 620° C. to about 750° C. As before, the consumption of the Si sidewall is reduced by half due to the capping of the CoSi film 11 with the Si sidewall cap 10. Following the second RTA, the unreacted Si sidewall cap 10 is removed by a highly selective etchant such as tetramethylammonium hydroxide (TMAH). The structure following the second RTA and the etching of the unreacted Si cap is illustrated in FIG. 9.

Figure 9:
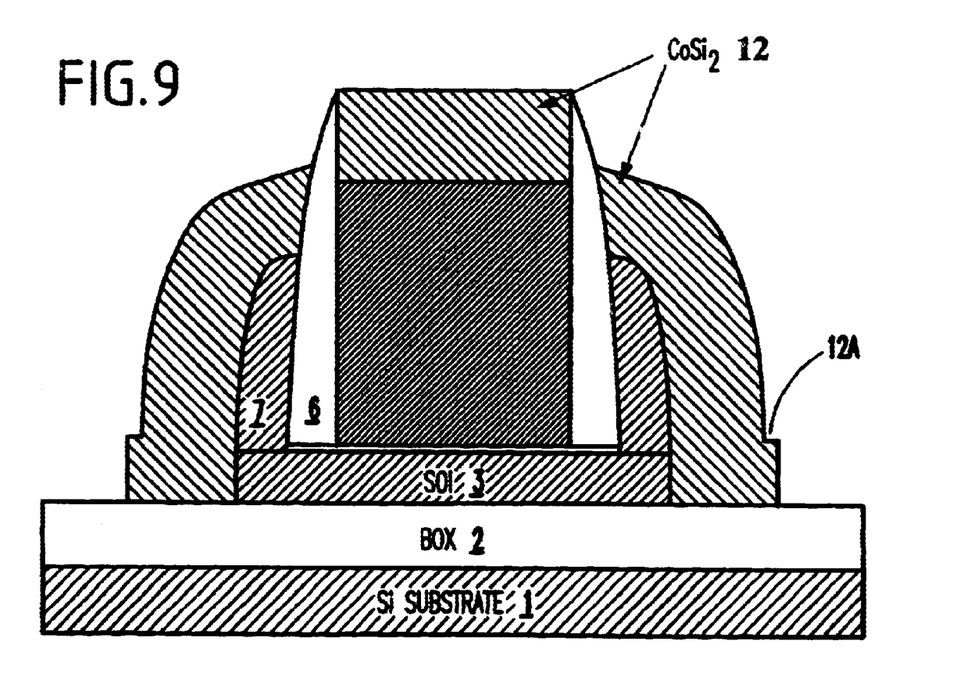
FIG. 9 illustrates the structure following a second RTA and an etching of the unreacted Si cap 9.

It is noted that FIG. 9 illustrates a unique sidewall in which a small step 12A is formed at the base of the sidewall 11. Such a small step 12A is formed because, when the silicon was there, not all of the silicon has been consumed. That is, going from the processing of FIG. 8 to FIG. 9 and the step 12A shown thereat, it can be imagined that there was too much silicon provided for the silicon cap 9 than was actually needed to form the disilicide. The reason an over-abundance of silicon is provided is to ensure that there is enough silicon present to form the disilicide and not to consume/deplete the silicon of the sidewall. Thus, the small step 12A is formed and is shown after the unreacted silicon has been etched selectively.

It is noted that the silicon consumption may be further reduced if a mixture of Co and Si replaces the pure Co film 8 deposition. The process of using Co alloys was first disclosed in the above-mentioned related application U.S. patent application Ser. No. 09/515,033. Thus, instead of a pure Co deposition (e.g., as shown in FIG. 6), Co can be co-deposited with Si. The use of a $Co_{1-x}Si_x$ mixture is limited to about x<0.3, otherwise bridging from source/drain to the gate would occur. The reduction in the Si consumption from the Si sidewall 7 is achieved due to various reasons.

For example, some of the silicon which is required to form the silicide phase is already contained in the deposited mixture, and thus the sidewall consumption is reduced.

Further, the temperature window in which the metal rich phase, $Co_2Si$, is formed is broadened to about 100° C. This makes it possible to replace the first anneal that forms the mono-silicide phase, CoSi, with a lower temperature anneal that would form the metal rich phase, $Co_2Si$. That would allow the removal of excess Co-Silicon mixture at the base of the Si sidewall 7 at an earlier stage of the silicidation process, thereby reducing the chance of the silicide encroaching onto the Si channel (e.g., see FIG. 4).

Additional methods may be combined with the present invention to further reduce the Si sidewall consumption by the silicide formation. For example, incorporating Ge into the Si sidewall 7 could force the disilicide, $CoSi_2$, to form mainly in the Si cap 10. The use of Ge was disclosed in the above-mentioned related U.S. patent application Ser. No. 09/712,264.

The incorporation of even small concentrations of Ge in the Si sidewall film pushes the $CoSi_2$ formation temperature to be significantly higher than the $CoSi_2$ formation temperature in pure Si. Thus, incorporating the Ge into the Si sidewall retards the formation temperature of the disilicide.

Figure 10:
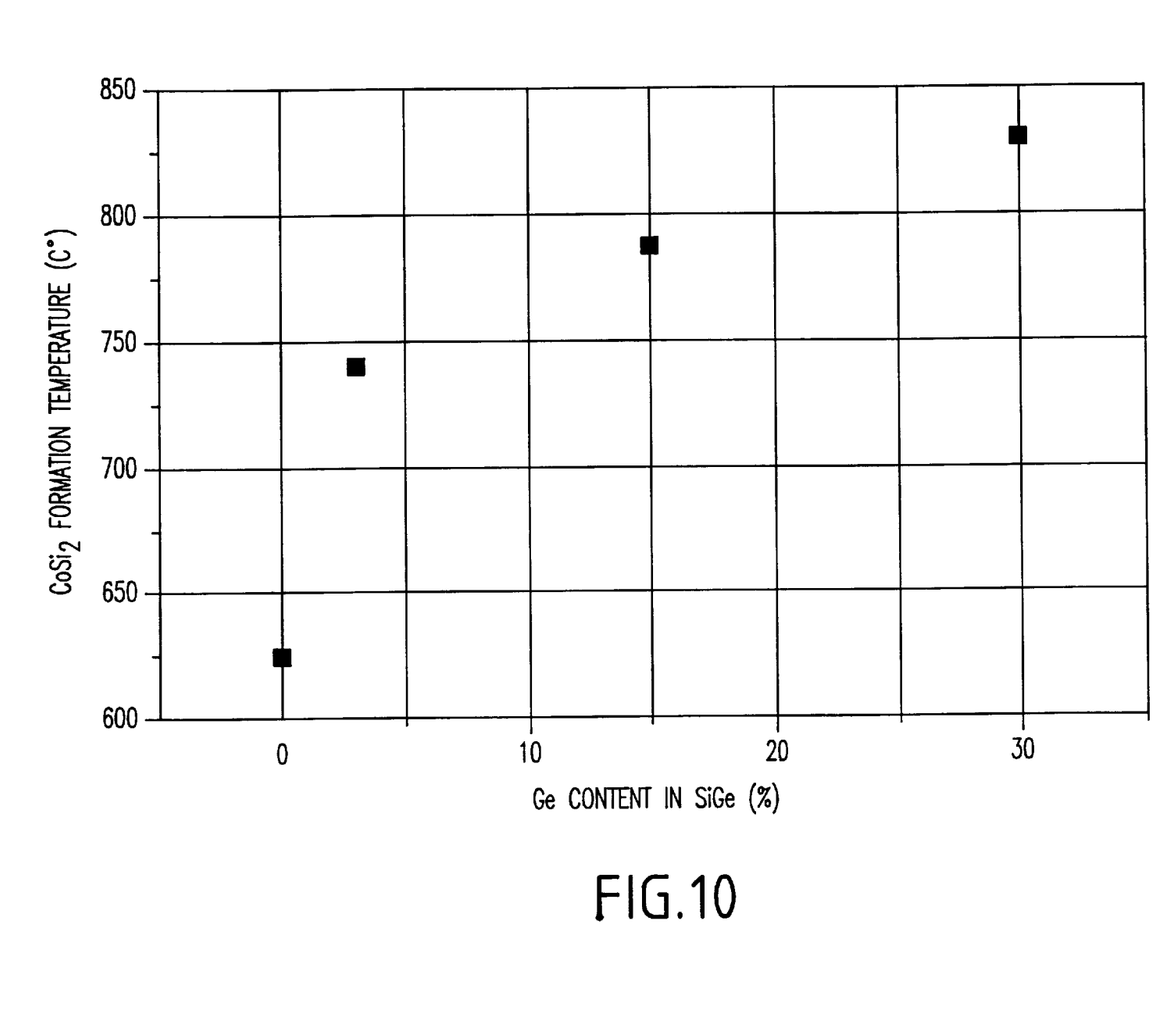
FIG. 10 illustrates the disilicide 11 (e.g., $CoSi_2$) formation temperature as a function of the Ge concentration in the Si film.

FIG. 10 illustrates the $CoSi_2$ formation temperature as a function of the Ge concentration in the Si film. For example, the formation temperature when using pure silicon (e.g., having 0% Ge shown at the first point on the left-hand side of FIG. 10), is 625° C. In contrast, if a small amount (e.g., 3–4%) of Ge is incorporated into the silicon sidewall, then the formation temperature increases to about 740° C. Similarly, if 15% Ge is incorporated into the silicon, then the formation temperature is approximately 780° C.

Hence, if the Si sidewall 7 is made of a SiGe alloy, and the second anneal temperature is chosen to be lower than the $CoSi_2$ formation temperature in SiGe, the silicide reaction would be limited only to the Si cap 10.

That is, in such a process, for the first anneal, there is no difference from the above discussion (e.g., the behavior and formation of the monosilicide is the same). However, for the second anneal (e.g., forming the disilicide), the anneal temperature can be tailored to the pure silicon cap. As such, there will be no reaction with the SiGe since the required reaction temperature is about 740° C., which is well above the reaction temperature (e.g., about 625° C.) for the pure silicon cap. Using this process, the Si consumption from the Si sidewall 7 is reduced by about 75%. (Moreover, when using this process combined with a mixture (alloy) of cobalt and silicon, the Si consumption from the sidewall could be reduced by about 80%.).

Figure 11A:
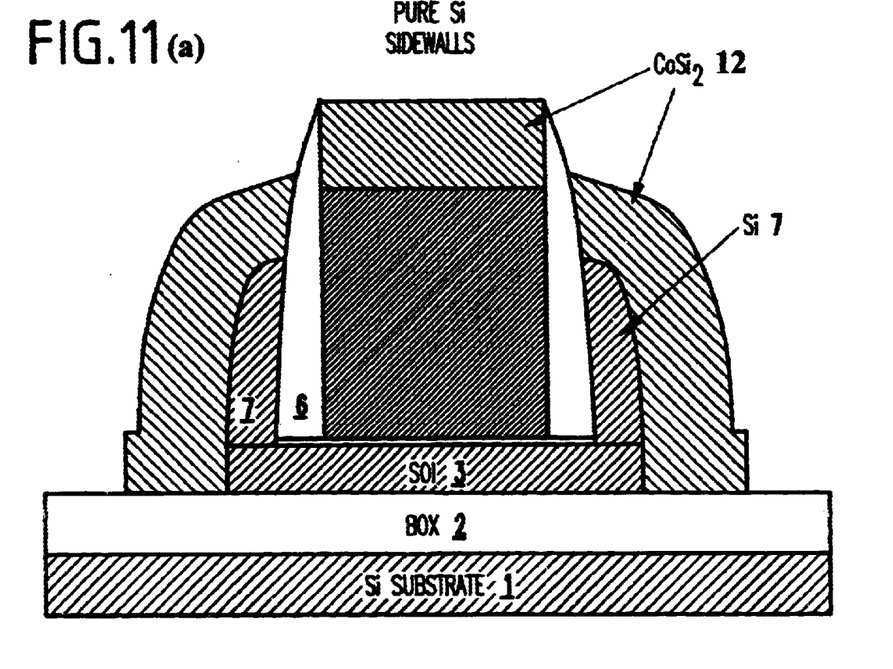
FIGS. 11(a) and 11(b) respectively illustrate comparing silicide formation in the case of a Si sidewall, and in the case of Ge incorporated into the Si sidewall.
Figure 11B:
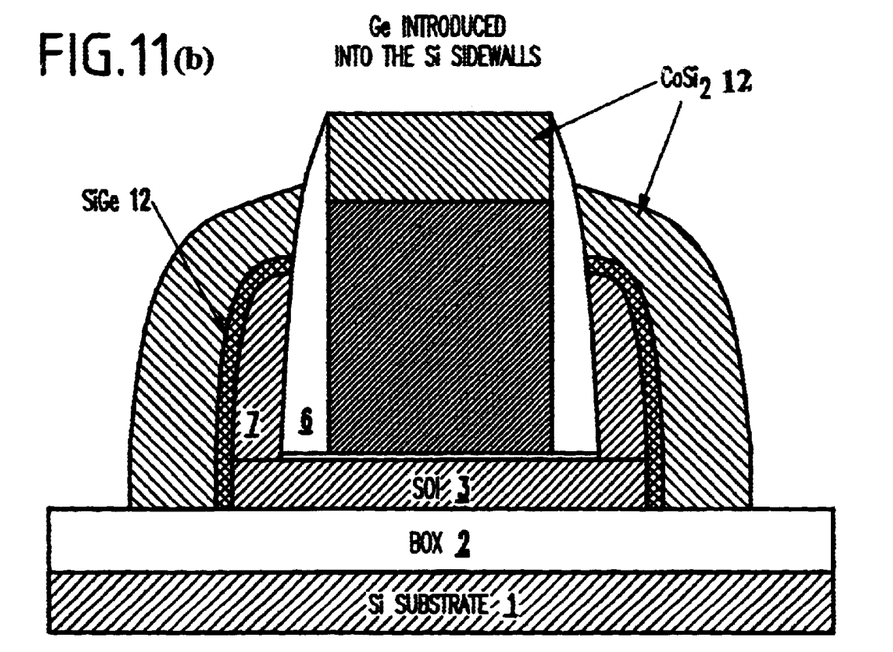

FIGS. 11A and 11B respectively compare the $CoSi_2$ formation in the case of a Si sidewall and in the case of a Si sidewall incorporating Ge. As shown in FIG. 11B, the sidewall is thicker and larger, and thus the contact area is much larger if Ge is present in the Si sidewall.

It is noted that the incorporation of Ge into the Si sidewall 7 can be achieved by a process including deposition of SiGe for the formation of the sidewalls 7, implanting Ge into the Si sidewall 7 prior to the Co film 8 deposition, and selective deposition of a thin Ge layer over the silicon source, drain and gate regions.

In contrast to selective silicon epitaxy which requires a high deposition temperature (e.g., within a range of about 850° C. to about 1200° C.), selective Ge deposition can be carried out at a low temperature.

Thus, with the unique and unobvious features of the present invention, a new self-aligned silicide process for silicon sidewall source and drain contacts has been described above.

The inventive process reduces the Si consumption of the sidewall source and drain, and thus increases the contact area, and lowers the series resistance.

Additionally, the problem of the silicide encroachment into the silicon channel is much better controlled than in the conventional process. The Co and Si cap deposition can be carried out sequentially without the need to expose the Co to ambient, thus a clean Co/Si interface is obtain. The process does not require an increase in the thermal budget compared to the conventional planer silicide process. The process is compatible with single gate and double gate structure MOSFETs, as described in Refs. 1 and 2 mentioned above.

While the invention has been described in terms of several preferred embodiments, those skilled in the art will recognize that the invention can be practiced with modification within the spirit and scope of the appended claims.

What is claimed is:

1. A method for forming a metal silicide contact on a non-planar silicon-containing region having controlled consumption of said non-planar silicon-containing region, comprising:

forming a blanket metal layer over said non-planar silicon-containing region;

forming a silicon layer over said metal layer;

etching anisotropically and selectively said silicon layer with respect to said metal;

reacting said metal layer with said silicon layer at a first temperature to form a metal silicon alloy;

etching unreacted portions of said metal layer;

annealing at a second temperature to form an alloy of metal-$Si_2$; and selectively etching enreacted portions of said silicon layer.

2. The method of claim 1, wherein said forming said blanket metal layer includes forming a metal layer containing a mixture of metal and silicon.

3. The method of claim 1, further including forming said non-planar silicon-containing region.

4. The method claim 3, wherein said forming of said non-planar silicon-containing region includes forming an alloy of SiGe.

5. The method of claim 4, wherein said forming said alloy of SiGe includes implanting Ge into said non-planar silicon containing region.

6. The method of claim 1, wherein said method is devoid of using any of a patterning of said metal layer and a mask.

7. The method of claim 1, wherein said method is self-aligned.

8. The method of claim 1, wherein said reacting further comprises reacting said metal layer with said non-planar silicon-containing region.

9. A method of forming a semiconductor structure, comprising:

providing a semiconductor substrate to be silicided including a sidewall source region and a sidewall drain region formed on respective sides of a gate;

forming a metal film over the gate and the sidewall source and sidewall drain regions;

forming a silicon film over said metal film;

etching anisotropically and selectively said silicon film with respect to said metal film;

reacting said metal film with said silicon film at a first temperature to form a metal-silicon alloy;

etching unreacted portions of said metal film;

annealing said structure at a second temperature to form a metal-$Si_2$ alloy over regions which are non-planar with respect to said substrate; and selectively etching unreacted portions of said silicon film.

10. The method of claim 9, wherein said metal includes at least one of Co, Ti, Pd, and Pt.

11. The method of claim 9, wherein said thin film of metal has a thickness in a range from about 0.3 nm to about 50 nm.

12. The method of claim 9, wherein said silicon film includes one of an amorphous Si (a-Si), a poly-Si, and a mixture thereof.

13. The method of claim 9, wherein said silicon film has a thickness in a range from about 15 nm to about 150 nm.

14. The method of claim 9, wherein said second temperature is higher than approximately 625° C.

15. The method of claim 9, wherein said sidewall source region comprises a silicon sidewall source region, and said sidewall drain region comprises a silicon sidewall drain region, and wherein said metal-silicon formation occurs in the deposited silicon film and in the silicon sidewall source region and silicon sidewall drain region.

16. The method of claim 6 wherein said sidewall source region comprises a silicon sidewall source region, and said sidewall drain region comprises a silicon sidewall drain region, and wherein said metal-$Si_2$ formation occurs in the deposited silicon film and in the silicon sidewall source region and silicon sidewall drain region.

17. The method of claim 9, wherein said second temperature is higher than said first temperature.

18. The method of claim 9, wherein said method is self-aligned whereby said method is devoid of using any of a patterning and a mask.

19. The method of claim 9, wherein said forming of said metal film includes forming a metal-silicon mixture by co-sputtering metal and silicon, a percentage of said silicon to said metal film being less than 28%.

20. The method of claim 9, wherein said metal film comprises 99.99% metal.

21. The method of claim 9, wherein said sidewall source region and said sidewall drain region are doped in advance of forming the metal-$Si_2$ alloy.

22. The method of claim 9, wherein said silicon film is etched into a silicon sidewall cap by a blanket directional etching including a reactive ion etching (RIE).

23. The method of claim 9, wherein said metal-$Si_2$ alloy is formed over region which are non-planar with respect to said substrate.

24. The method of claim 9, wherein said reacting further comprises reacting said metal layer with said sidewall source region and said sidewall drain region.

25. The method of claim 9, wherein said metal film is cobalt.

26. The method of claim 25, wherein said first temperature is in a range from about 481° C. to about 625° C.

27. The method of claim 26, further comprising:

selectively etching any unreacted metal.

28. The method of claim 9, wherein said metal film comprises a metal-silicon mixture.

29. The method of claim 28, wherein said reacting is performed at a temperature to form a metal-rich phase and said etching of said unreacted portions includes etching the unreacted metal-silicon mixture.

30. The method of claim 29, wherein said metal-rich phase is $Co_2Si$.

31. A method of forming a silicide, including:

providing a substrate to be silicided including forming a metal-silicon mixture over predetermined regions of said substrate;

forming a silicon film over said metal-silicon mixture;

etching anisotropically and selectively said silicon film with respect to said metal-silicon mixture;

reacting said metal-silicon mixture with said silicon film at a first temperature to form a metal-rich phase;

etching any unreacted portion of the metal-silicon mixture;

annealing said substrate at a second temperature, to form a metal-$Si_2$ alloy over regions of said predetermined regions which are non-planar with respect to said substrate; and selectively etching unreacted portions of said silicon film.

32. The method of claim 31 wherein the metal is blanket deposited and is continuous such that no patterning of said metal is performed.

33. The method of claim 31, wherein said regions of said predetermined regions which are non-planar include a sidewall source region and a sidewall drain region, and wherein said sidewall source region and said sidewall drain region are doped in advance of forming the metal-$Si_2$ alloy.

34. The method of claim 31, wherein said silicon film is etched into a silicon sidewall cap by a blanket directional etching including a reactive ion etching (RIE).

35. The method of claim 31, wherein said reacting further comprises reacting said metal layer with said predetermined regions of said substrate.

* * * * *